(12) United States Patent
Lesso

(10) Patent No.: US 10,566,992 B2
(45) Date of Patent: Feb. 18, 2020

(54) MODULATORS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/375,868

(22) Filed: Apr. 5, 2019

(65) Prior Publication Data

US 2019/0288704 A1 Sep. 19, 2019

Related U.S. Application Data

(63) Continuation of application No. 16/105,746, filed on Aug. 20, 2018, now Pat. No. 10,256,837.

(Continued)

(30) Foreign Application Priority Data

Oct. 9, 2017 (GB) .................................. 1716468.2

(51) Int. Cl.
*H03M 3/00* (2006.01)
*H03K 21/38* (2006.01)
(Continued)

(52) U.S. Cl.
CPC .......... *H03M 3/39* (2013.01); *H03K 3/02337* (2013.01); *H03K 21/38* (2013.01);
(Continued)

(58) Field of Classification Search
CPC .......... H03M 3/39; H03M 1/06; H03M 3/456; H03M 3/376; H03M 3/432; H03M 1/508;
(Continued)

(56) References Cited

U.S. PATENT DOCUMENTS 5,559,514 A 9/1996 Thomson
7,279,875 B2 * 10/2007 Gan .................... H02M 3/1588
323/282

(Continued)

FOREIGN PATENT DOCUMENTS

DE 2420519 A1 11/1975
DE 10233391 C1 12/2003
(Continued)

OTHER PUBLICATIONS

Combined Search and Examination Report under Sections 17 and 18(3), UKIPO, Application No. GB1716468.2, dated Apr. 9, 2018.
(Continued)

*Primary Examiner* — Khai M Nguyen
(74) *Attorney, Agent, or Firm* — Jackson Walker L.L.P.

(57) ABSTRACT

This application relates to time-encoding modulators (301, 700) having a self-oscillating modulator module configured to receive an input signal and output a pulse-width modulated signal ($S_{PWM}$) where the pulse-width modulated signal is synchronised to a first clock signal ($CLK_1$). A hysteretic comparator module (302) located in a feedforward path is configured to generate the time encoded signal ($S_{PWM}$) at a first node (304) based on the input signal ($S_{IN}$) and a feedback signal ($S_{FB}$). A feedback path is coupled to the first node to provide the feedback signal, which is either applied to an input of the hysteretic comparator module via a loop filter (701) in the feedback path or applied to the feedforward path prior to a loop filter (701) upstream of the hysteretic comparator module (302). The hysteretic comparator module (302) is configured such that any change in state of the time encoded signal at the first node is synchronised to the first clock signal ($CLK_1$).

20 Claims, 4 Drawing Sheets

Related U.S. Application Data

(60) Provisional application No. 62/552,452, filed on Aug. 31, 2017.

(51) Int. Cl.
  *H03K 3/0233* (2006.01)
  *H03M 1/50* (2006.01)
  *H03K 7/08* (2006.01)

(52) U.S. Cl.
  CPC ........... *H03M 1/508* (2013.01); *H03M 3/376* (2013.01); *H03M 3/432* (2013.01); *H03M 3/456* (2013.01); *H03K 7/08* (2013.01)

(58) Field of Classification Search
  CPC .. H03K 3/02337; H03K 21/38; H03K 5/1565; H03K 7/08
  USPC ......................................... 341/131, 143, 155
  See application file for complete search history.

(56) References Cited

U.S. PATENT DOCUMENTS

| | | | |
|---|---|---|---|
| 7,515,084 | B1 | 4/2009 | Cruz-Albrecht et al. |
| 7,532,082 | B2 | 5/2009 | Clara et al. |
| 7,573,956 | B2 | 8/2009 | Lazar et al. |
| 7,750,835 | B1 | 7/2010 | Cruz-Albrecht et al. |
| 8,212,700 | B2 | 7/2012 | Zoso |
| 9,705,519 | B1 * | 7/2017 | Baringer ............. H03M 7/3073 |
| 2003/0063021 | A1 | 4/2003 | Gude |
| 2006/0187099 | A1 | 8/2006 | Fujimoto |
| 2008/0169953 | A1 | 7/2008 | Yamamoto et al. |
| 2010/0045499 | A1 | 2/2010 | Rivoir |
| 2012/0098686 | A1 | 4/2012 | Wang |
| 2013/0300592 | A1 | 11/2013 | Snelgrove |
| 2016/0359500 | A1 | 12/2016 | Lesso et al. |

FOREIGN PATENT DOCUMENTS

| | | |
|---|---|---|
| DE | 102005052702 A1 | 5/2007 |
| JP | 2014127764 A | 7/2014 |
| WO | 2004105251 A1 | 12/2004 |
| WO | 2005029708 A1 | 3/2005 |
| WO | 2009137512 A1 | 11/2009 |

OTHER PUBLICATIONS

International Search Report and Written Opinion of the International Searching Authority, International Application No. PCT/GB2018/051461, dated Oct. 24, 2018.

Combined Search and Examination Report under Sections 17 and 18(3), UKIPO, Application No. GB1711164.2, dated Jan. 8, 2018.

Lazar, A.A. et al., "Perfect Recover and Sensitivity Anaysis of Time Encoded Bandlimited Signals", IEEE Transactions on Circuits and Systems Part I: Regular Papers, IEEE Service Center, NY, NY, US, Oct. 1, 2004, pp. 2060-2073.

Combined Search and Examination Report under Sections 17 and 18(3), UKIPO, Application No. GB1813804.0, dated Feb. 15, 2018.

International Search Report and Written Opinion of the International Searching Authority, International Application No. PCT/GB2018/052368, dated Jan. 10, 2019.

Ortmanns, M. et al., "Continuous-time Sigma-delta A/D Conversion: Fundamentals, Performance Limits and Robust Implementations", Aug. 12, 2005, Springer, pp. 56-78, 63-65, Figure 3.1.

International Search Report and Written Opinion of the International Searching Authority, International Application No. PCT/GB2019/052124, dated Dec. 3, 2019.

Silva-Martinez, J., Wideband Continuous-Time Multi-Bit Delta-Sigma AOCs, Mar. 31, 2012, https://pdfs.semanticscholar.org/eb2c/d8144eca2ac3c8fb24c025ee667ffa80499b.pdf, retrieved Sep. 19, 2019, col. 4-col. 5, claim 1, figure 3(a).

* cited by examiner

MODULATORS

The present application is a continuation of United States Non-Provisional Patent Application No. 16/105746, filed Aug. 20, 2018, which claims priority to United States Provisional Patent Application Ser. No. 62/552452, filed Aug. 31, 2017, and United Kingdom Patent Application No. 1716468.2, filed Oct. 9, 2017, each of which is incorporated by reference herein in its entirety.

TECHNICAL FIELD

This application relates to methods and apparatus for modulation and demodulation of signals, and in particular to time-encoding modulators and to methods and apparatus using time-encoding modulators.

BACKGROUND

Signal modulators are utilized in a number of applications, for instance as part of the conversion from analogue signals to digital signals or vice versa.

Conventionally analogue-to-digital converters (ADCs) and digital-to-analogue converters (DACs) are implemented using multiple analogue components such as banks of well-matched or ratioed resistors, capacitors or current sources. However there is an ongoing trend to smaller semiconductor process node geometries and such circuitry does not scale efficiently in terms of semiconductor area and/or power requirements.

Time-encoding modulators are modulators that encode input data into a time-encoded data stream. The time-encoded data stream can then be decoded using a time decoding converter. One particular application of a time-encoding modulator is as part of an analogue-to-digital converter (ADC) where a time-encoding modulator is used to encode an input analogue signal as the duty cycle of a pulse-width modulated (PWM) signal. The PWM signal is input to a time-decoding converter (TDC) which outputs a digital signal indicative of the duty-cycle of the PWM signal. In practice the TDC has a voltage-controlled oscillator (VCO) which is controlled based on the PWM signal and a counter arranged to count the oscillations in the VCO output. The average count value over a period of time depends on the duty cycle of the PWM signal and thus can be used as digital representation of the input analogue signal.

Such an ADC circuit may be used in a number of applications. Increasingly however there is a demand for low power operation. For example, as voice control is becoming more popular for electronic devices, there may be a need for audio circuitry of the electronic device to be always-on to listen for a possible voice command. The processing to detect voice commands is implemented digitally so there may be implementations requiring an ADC circuit to continually operate to convert analogue audio signals from a microphone transducer into digital audio signals for voice detection. Similarly, there is a trend to replace mechanical control buttons by virtual buttons relying on force-sensing transducers to sense local pressure applied by a user and requiring some continual conversion of one or more analogue force sensor output signals to a digital form for convenient processing for robust detection of user input in an always-on modality. Especially for battery powered devices, power consumption is a concern and thus low power operation is often desirable.

One issue with an ADC circuit such as described above is that typically the VCO needs to operate at relatively high frequencies to provide acceptable noise performance and this can result in a relatively high power consumption. VCO circuits implemented in smaller process node geometries still suffer from relatively high power requirements.

In general therefore there is thus a desire for modulators that can be used, for example, as part of a signal converter such as an ADC that can be operated with relatively low power.

SUMMARY

Embodiments of the present disclosure relate to improved time-encoding modulators.

Thus according to an aspect there is provided a time-encoding modulator comprising:
- a feedforward path for receiving an input signal and outputting a time encoded signal;
- a hysteretic comparator module in the feedforward path configured to generate the time encoded signal at a first node based on the input signal and a feedback signal;
- a feedback path coupled to the first node to provide the feedback signal; and
- a loop filter configured to apply filtering to one of: the feedback path; or the feedforward path upstream of the hysteretic comparator module;
- wherein the hysteretic comparator module is configured such that any change in state of the time encoded signal at the first node is synchronised to a first clock signal.

In some embodiments the hysteretic comparator module may comprise a latched comparator configured to receive the first clock signal, wherein any changes in output state of the latched comparator is synchronised to the first clock signal. In some embodiments the hysteretic comparator module may comprise a hysteretic comparator and a latch coupled to an output of the hysteretic comparator, wherein the latch is configured to be clocked by the first clock signal.

In some implementations the modulator may be configured such that the feedback signal is combined with the input signal to generate an error signal in the forward signal path. In which case the loop filter may be configured to apply filtering to the error signal in the forward signal path. A first comparator input of the hysteretic comparator module may be coupled to receive the filtered error signal. The loop filter may comprise an integrator.

In some implementations a first comparator input of the hysteretic comparator module may be coupled to receive a version of the input signal and a second comparator input of the hysteretic comparator module may be coupled to receive the feedback signal. In which case the loop filter may be configured to apply filtering to the feedback path. The loop filter may comprise a resistor in series in the feedback path and a capacitor coupled between a node of the feedback path and a reference voltage.

In some embodiments the time-encoding modulator may further comprise a hysteresis controller for controlling an amount of hysteresis applied by the hysteretic comparator module. The hysteresis controller may be configured to control the hysteresis so as to maintain a cycle period of the time encoded signal within a defined range on a cycle-by-cycle basis. The hysteresis controller may be configured to dither the hysteresis applied so as reduce the likelihood of unwanted tones in the time encoded signal.

In some implementations, the time-encoding modulator may be operable in a first mode with a limit cycle frequency (for a quiescent input signal) equal to a first frequency and also in a second mode with a limit cycle frequency equal to a second different frequency, and wherein the hysteresis controller is operable to vary the amount of hysteresis applied by the hysteretic comparator module so as to implement the first and second modes. The first frequency may be higher than the second frequency. The first mode may corresponds to a higher power mode than the second mode. The time-encoding modulator may be configured to selectively operate in the first mode or the second mode based on an indication of signal activity in the input signal.

Embodiments also relate to a modulator circuit comprising any of the variants of time-encoding modulator and a counter. The counter may be configured to receive the time encoded signal and generate count values of the number of clock periods of a second clock signal during periods defined by the time encoded signal. The second clock signal may be synchronised to the first clock signal and in some implementations may be the same as the first clock signal. The time encoded signal may comprise cycles of pulses of first and second states and the counter may be configured to generate a first count value for the duration of the pulse of the first state of the time-encoded signal during each cycle. The counter may further be configured to generate a second count value for the duration of the pulse of the second state of the time-encoded signal during each cycle and/or the counter may be configured to generate a cycle count value for the duration of each cycle. In some implementations the counter may be configured to increment during the pulse of one state and to decrement during the pulse of the other state of a cycle so as to generate a difference count value for each cycle.

The modulator circuit may comprise a demodulator configured to receive the count values from the counter and generate a digital output signal. The demodulator may comprise a sigma-delta demodulator. The sigma-delta demodulator may comprise an input for receiving a first received value, an adder for adding the first received value to an output from a modulus block and a memory for storing the output of the adder. The sigma-delta demodulator may also comprise a comparator for comparing a value stored in the memory to a second received value. The modulus block may be configured to apply a modulo operation to the output of the memory based on the second received value. The first and second values may be derived from the count values. The first received value may correspond to a first count value for the duration of the pulse of the first state of the time-encoded signal during each cycle. The second received value may correspond to the sum of the first count value and a second count value for the duration of the pulse of the second state of the time-encoded signal during each cycle. The modulus block may comprise a multiplexor having a first input for receiving a value from the memory and a second input for receiving the value from the memory from which the second received value has been subtracted. The multiplexor may be configured to output the first input when the output of the comparator is low and outputs the second input when the output of the comparator is high.

When the modulator circuit has a hysteresis controller and a demodulator, the hysteresis controller may be configured to control the hysteresis applied by the hysteretic comparator module based on the output of the demodulator.

In some embodiments the modulator circuit may comprise a filter arrangement configured to filter the count values provided to the demodulator.

Embodiments also relate to an analogue-to-digital converter comprising the modulator circuit as discussed in any of the variants above. The analogue-to-digital converter may be configured to receive an input audio analogue signal. The analogue-to-digital converter may be configured to receive an input signal from a force sensor transducer.

Embodiments also relate to an integrated circuit comprising the modulator circuit as discussed in any of the variants above or the analogue-to-digital converter discussed in any of the variants above.

Embodiments also relate to an electronic device comprising any of the variants of time-encoding modulator, any of the variants of modulator circuit, any of the variants of the analogue-to-digital converter or the integrated circuit. The device may be at least one of: a portable device; a battery powered device; a communications device; a mobile or cellular telephone; a smartphone; a computing device; a notebook, laptop or tablet computing device; a wearable device; a smartwatch; a voice-controlled device; a gaming device.

In another aspect there is provided a method of time-encoding modulation comprising:
  receiving an input signal at an input to a feedforward path, the feedforward path comprising a hysteretic comparator module configured to generate the time encoded signal at a first node based on the input signal and a feedback signal;
  wherein the feedback signal is derived from the first node and a loop filter is configured to apply filtering to one of: the feedback path; or the feedforward path upstream of the hysteretic comparator module;
  wherein the method comprises operating the hysteretic comparator module such that any change in state of the time encoded signal at the first node is synchronised to a first clock signal.

In a further aspect there is provided a time-encoding modulator comprising:
  a self-oscillating modulator module configured to receive an input signal and output a pulse-width modulated signal;
  wherein the self-oscillating modulator module has a clock input for receiving a first clock signal and is configured such that the pulse-width modulated signal is synchronised to the first clock signal.

In a further aspect there is provided a time-encoding modulator comprising:
  a feedforward path for receiving an input signal and outputting a time encoded signal;
  a hysteretic comparator module in the feedforward path configured to generate the time encoded signal at a first node;
  a feedback path coupled to the first node to provide a feedback signal; wherein the feedback signal is either applied to:
  an input of the hysteretic comparator module via a loop filter in the feedback path; or
  the feedforward path prior to a loop filter, the loop filter being upstream of the hysteretic comparator module;
  wherein the hysteretic comparator module is configured such that any change in state of the time encoded signal at the first node is synchronised to a first clock signal.

In a further aspect there is provided a time-encoding modulator comprising:
  a feedforward path for receiving an input signal and outputting a time encoded signal, the feedforward path comprising a loop filter upstream of a hysteretic comparator module; and
  a feedback path for providing a feedback signal from an output of the hysteretic comparator module to be combined with the input signal, wherein the loop filter is configured to apply filtering to the combined input and feedback signals and the hysteretic comparator module is configured to receive the output of the loop filter and to generate the time encoded signal at the output of the hysteretic comparator module output; and wherein the hysteretic comparator module is configured such that any change in state of the time encoded signal at the hysteretic comparator module output is synchronised to a first clock signal.

In a further aspect there is provided a time-encoding modulator for receiving an input signal and outputting a time encoded signal comprising:

a hysteretic comparator module configured to receive the input signal at a first input and a feedback signal at a second input and to generate a time encoded signal at an output node;

a feedback path coupled to the output node to provide the feedback signal to the second comparator input, and a loop filter configured to apply filtering to the feedback path;

wherein the hysteretic comparator module is configured such that any change in state of the time encoded signal at the hysteretic comparator module output is synchronised to a first clock signal.

In a further aspect there is provided a time-encoding modulator comprising: a hysteretic comparator module configured to generate a time encoded signal based on an input signal; wherein the hysteretic comparator module is configured such that any change in state of the time encoded signal is synchronised to a first clock signal.

In a further aspect there is provided an analogue-to-digital converter comprising:

a time encoding module comprising a hysteretic comparator, wherein the time encoding module is configured to encode an analogue input signal as the duty cycle of cyclic pulses of a time encoded signal, wherein the pulses of the time encoded signal are synchronised to a first clock signal; and a counter configured to receive the time encoded signal and the first clock signal and to generate count values of the number of clock periods of the first clock signal within periods defined by the cyclic pulses of the time encoded signal.

BRIEF DESCRIPTION OF THE DRAWINGS

To better explain and illustrate aspects of the present disclosure, various embodiments will now be described, purely by way of example only, with reference to the accompanying drawings, of which.

DETAILED DESCRIPTION

As noted above, time-encoding modulators (TEMs) may be used in a variety of applications, such as an ADC circuit.

Figure 1:
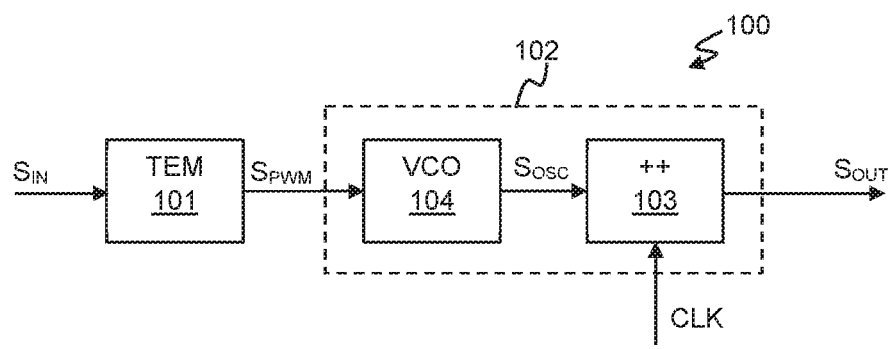
FIG. 1 illustrates an example of a time-encoding modulator based ADC circuit.

FIG. 1 illustrates an example of a time-encoding based ADC circuit 100. An input analogue signal $S_{IN}$ is input to a time-encoding modulator 101. In this example the time-encoding modulator 101 is arranged to encode the input signal as a pulse-width modulated (PWM) signal $S_{PWM}$. The PWM signal $S_{PWM}$ is a signal that alternates between two different signal levels, where the proportion of time spent in one state during the cycle, i.e. the duty cycle, encodes the signal level of the input signal $S_{IN}$. Conveniently, to avoid the need for a defined cyclic precision reference waveform, the time-encoding modulator 101 may be a self-oscillating modulator, for example an asynchronous sigma-delta modulator (ASDM) or the like.

Figure 2:
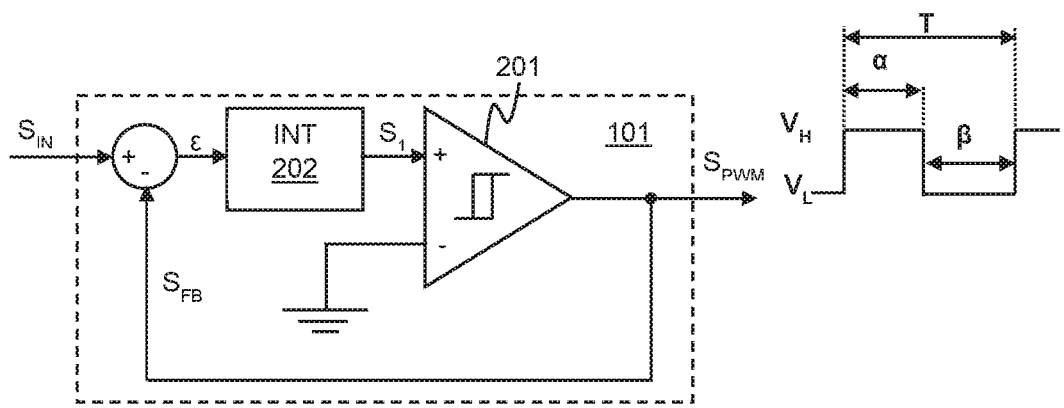
FIG. 2 illustrates an example of typical asynchronous sigma-delta modulator.

FIG. 2 illustrates a conventional ASDM which may be used as the TEM 101 in the ADC circuit of FIG. 1. The ASDM has a hysteretic comparator 201 which generates an output at either a first or a second signal level, e.g. $V_H$ and $V_L$, based on the comparison of a first signal received at a first comparator input to defined thresholds. In the example of FIG. 2 a fixed reference voltage, in this example ground, is supplied to a second comparator input and the hysteretic comparator 201 compares the first signal at the first input to the fixed reference voltage supplied to the second comparator input. The hysteretic comparator 201 applies hysteresis to the comparison and will swap from the first output state to the second output state when the first signal $S_1$ at the first input exceeds the signal at the second input by an amount H, but will only swap back to the first state when the signal $S_1$ at the first input drops below the signal at the second input by an amount H, where H corresponds to the amount of hysteresis applied. In this example, where the second comparator input is at ground, the signal $S_1$ at the first comparator input must therefore increase to a threshold +H to swap from one output state to the other and then drop to a threshold of −H to swap back again. Thus in effect the hysteretic comparator 201 compares the first signal $S_1$ received at the first input with thresholds defined, with respect to a reference voltage, by the amount of hysteresis of the hysteretic comparator 201. One skilled in the art will appreciate that the fixed reference voltage may be supplied to a defined comparator input as illustrated in FIG. 2, but in some embodiments the thresholds, e.g. +H and −H, may be defined by the structure of the comparator and there may not be a distinct second input as such. For ease of explanation embodiments will be described with reference to first and second comparator inputs.

One skilled in the art will also appreciate that whilst the hysteresis applied may be symmetric in this way, i.e. the magnitude of the hysteresis applied in each direction is the same, this need not be the case. In some implementations the signal at the first input may need to exceed the signal at the second input by a first amount $H_1$ to switch output state but drop below the signal at the second input by a second, different amount $H_2$ to switch back. For ease of explanation the embodiments will be described with reference to symmetric hysteresis of an amount H being applied.

To provide the first signal $S_1$ for the first input of the hysteretic comparator 201, a feedback signal $S_{FB}$ derived from the output of the hysteretic comparator 201 is combined with the input analogue signal $S_{IN}$, and the resulting combined signal is integrated by integrator 202 to provide the first signal $S_1$. In this example the feedback signal $S_{FB}$ is subtracted from the input signal $S_{IN}$ to provide an error signal ϵ indicative of the difference between the input signal $S_{IN}$ and the feedback signal. However in other implementations the feedback signal $S_{FB}$ could be combined with the input signal $S_{IN}$ in other ways, for example the two signals could be summed and/or level shifting could be applied to the feedback signal $S_{FB}$ and/or the input signal $S_{IN}$.

It will be understood that value of the combined signal, e.g. the error ϵ between the input signal $S_{IN}$ and the feedback signal $S_{FB}$, will thus depend on the level of the analogue input signal $S_{IN}$ and also the output state of the hysteretic comparator, e.g. $V_H$ or $V_L$. Thus, for example, for a high level input signal $S_{IN}$, the error ϵ when the hysteretic comparator 201 is outputting a high output state will be lower in magnitude than when hysteretic comparator 201 is outputting a low output state. Conversely, if the input signal $S_{IN}$ were summed with the feedback signal $S_{FB}$ the magnitude of the combined signal would be higher for a high level input signal $S_{IN}$ when the hysteretic comparator 201 is outputting a high output state than when hysteretic comparator 201 is outputting a low output state. Thus the time taken for the integrated signal $S_1$ to change from +H to −H and vice versa will vary depending on the level of the input signal $S_{IN}$ and how close it is to the level of the output state. The result is that the output of the hysteretic comparator 201 is a pulse-width modulated signal $S_{PWM}$, which cycles between a pulse of one state for a duration α and a pulse of the other state for a duration β. As will be understood by one skilled in the art, for the example illustrated in FIG. 2, as the level of the input signal $S_{IN}$ changes, the durations α and β will vary, as will the overall cycle period T (T=α+β), but the level of the input signal $S_{IN}$ will be encoded by the duty cycle, i.e. (α−β)/T (or alternatively as α/T or β/T). An input signal $S_{IN}$ which has a level which corresponds to a midpoint voltage $V_{MID}$ between the two output states $V_H$ and $V_L$ of the hysteretic comparator 201 will lead to a duty cycle of 50% for each state, as the magnitude of the error ϵ will be substantially the same for each output state of the hysteretic comparator 201. The input signal $S_{IN}$ may be referred to such a midpoint voltage so that an input signal level at the midpoint voltage corresponds to zero magnitude, in which case the input signal may vary in magnitude and polarity and the duty cycle (α−β)/T encodes the signal level.

Referring back to FIG. 1, the time-encoded signal $S_{PWM}$ is input to a time-decoding converter (TDC) 102 which converters the time-encoded signal $S_{PWM}$ to a digital output signal $S_{OUT}$. The TDC 102 comprises a counter 103 which receives a clock signal CLK.

In theory, the clock signal CLK could be a fast clock signal and the counter 103 could be arranged to count the number of pulses of the fast clock signal during the period α of one state of the time-encoded signal $S_{PWM}$ and also the number of pulses of the fast clock signal during the period β of the other state. These two count values could be used to derive the duty cycle of the time-encoded signal $S_{PWM}$. However in such case a quantisation error would be determined by the time resolution of the counter, which would depend on the frequency of the fast clock signal. Thus, for example, if the fast clock signal had a frequency of, say, 100 MHz, the difference between a count value of N and a count value of N+1 corresponds to a difference in time of 10 ns and thus the minimum time resolution of the TDC would be 10 ns. The resulting quantisation noise spectrum of a purely counter based TDC is effectively flat. To provide a sufficient time resolution to provide an acceptable quantisation error would require the fast clock signal to be very fast, for instance of the order of several GHz. Such a fast clock speed is undesirable for power and practicality reasons.

Practically therefore the TDC 102 comprises a voltage controlled oscillator (VCO) 104 arranged to be controlled by the time-encoded signal $S_{PWM}$. The VCO 104 outputs an oscillation signal $S_{OSC}$ where the frequency of the oscillations depends on the signal level of the input to the VCO 104, i.e., the time-encoded signal $S_{PWM}$. The counter 103 is arranged to receive the oscillation signal $S_{OSC}$ from the VCO 104 and count the number of oscillations in a frame period defined by the clock signal CLK. Over the course of several frames the average count value will depend on the amount of time that the time-encoded signal $S_{PWM}$ spends in one state, thus controlling the VCO 104 to output a first frequency, compared to the amount of time that the time-encoded signal $S_{PWM}$ spends in the other state, thus controlling the VCO 104 to output a second frequency. Thus the average count value is related to the duty cycle of the time-encoded signal $S_{PWM}$ and hence the level of the input signal $S_{IN}$. The count value can be normalised to some desired range and output as a digital output signal $S_{OUT}$ representative of the input signal $S_{IN}$.

The use of a VCO 104 provides some noise shaping, as would be understood by one skilled in the art. The quantisation error at low frequencies associated with the counter 103 is reduced as any error in one frame, e.g. any difference between the clock edge defining the end of the frame and the end of the oscillation at the end of the frame, is carried forward to the next frame. The quantisation noise at higher frequencies is increased, but this may be readily removed by downstream digital filtering without affecting the audio signal frequency band. The use of a VCO 104 thus allows accurate conversion with clock rates that are significantly lower than the clock rates of several GHz mentioned above that may be needed for use of a counter alone.

However whilst such an ADC circuit 100, with a VCO based TDC, provides good performance for a number of applications, the power requirements for the VCO 104 may be disadvantageous in some instances.

Embodiments of the present disclosure relate to time-encoding modulators which at least mitigate at least some of the above mentioned issues. Embodiments of the present disclosure relate to time-encoding modulators where transitions in the time-encoded signal are synchronised to a first clock signal. Thus, for a PWM time-encoded signal the period α of a pulse of one state and the period β of a pulse of the other state are synchronised to the first clock signal. By synchronising the transitions in the time-encoded signal to the first clock signal, a counter which is clocked by the first clock signal (or synchronous clock signal derived therefrom) can be used produce count values corresponding to the duration of the time-encoded signal directly, without any error being introduced by the counter. As explained below, any overshoot in the analogue signal applied to the comparator is carried forward to the next frame, providing noise shaping to reduce signal-band quantisation noise.

Embodiments thus relate to a time-encoding modulator circuit having a feedforward path for receiving an input signal and outputting a time encoded signal. A hysteretic comparator module is located in the feedforward path and configured to generate the time encoded signal at a first node, based on the input signal and a feedback signal. A feedback path is coupled to the first node to provide the feedback signal. The circuit also has a loop filter. The loop filter may, in some embodiments, be arranged to apply filtering to the feedforward path upstream of the hysteretic comparator module, in which case the feedback signal may be combined with the input signal in the feedforward path prior to filtering. The loop filter could, for instance be an integrator as discussed above in relation to FIG. 2. In other embodiments however the loop filter may be arranged to apply filtering to the feedback path as will be described in more detail below. In which case the input signal may be applied to a first input of the hysteretic comparator module and the feedback signal output from the filter may be applied to a second comparator input. In either case, the hysteretic comparator module is configured such that any change in state of the time encoded signal at the first node is synchronised to a first clock signal.

Figure 3:
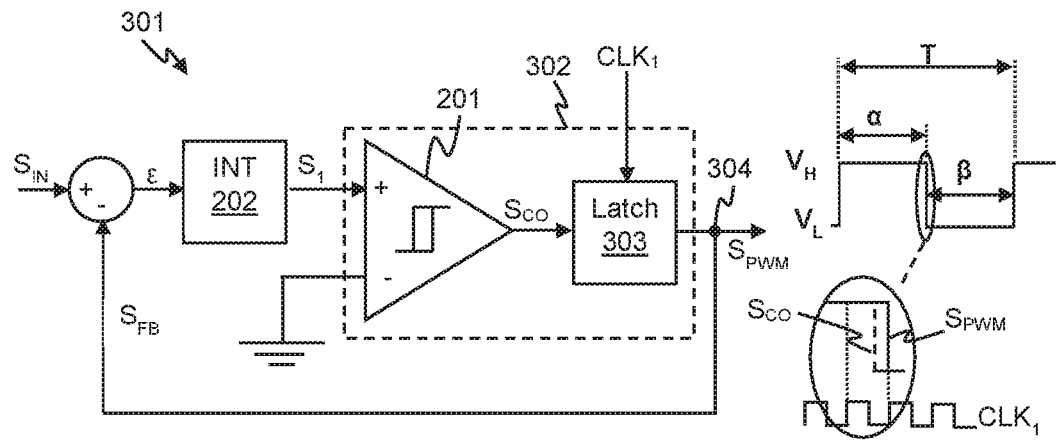
FIG. 3 illustrates a time-encoding modulator according to an embodiment.

FIG. 3 illustrates one example of a time-encoding modulator 301 according to an embodiment. In this embodiment the time-encoding modulator 301 is based on a similar topology as an asynchronous sigma-delta modulator such as described with respect to FIG. 2 and similar components are identified using similar reference numerals.

In the time-encoding modulator 301 the input signal $S_{IN}$, which may be an analogue input signal, is combined with a feedback signal $S_{FB}$ derived from the output $S_{PWM}$ of the time-encoding modulator 301 so as to provide a combined signal. In the example illustrated in FIG. 3 the feedback signal $S_{FB}$ is subtracted from the input signal $S_{IN}$ to provide an error signal $\epsilon$, however, in some embodiments, the feedback signal $S_{FB}$ could be combined with the input signal $S_{IN}$ in other ways such as discussed above, for example the two signals could be summed and/or level shifting could be applied to at least one of the input signal $S_{IN}$ and the feedback signal $S_{FB}$. This error signal $\epsilon$ is filtered, in this example integrated by integrator 202, to provide a first signal $S_1$ which is input to a hysteretic comparator module 302. In this example a second input of the hysteretic comparator module 302 is coupled to a defined reference voltage, such as ground, although, in some embodiments, there may not be a defined second input as such and the hysteretic comparator may compare the first signal $S_1$ to thresholds defined by the configuration of the hysteretic comparator module 302. The hysteretic comparator module 302 is configured to apply a hysteretic comparison in a similar manner as discussed above in relation to FIG. 2, so as to effectively compare the first signal $S_1$ received at the first input to defined thresholds based on the amount of hysteresis. However in embodiments of the disclosure the hysteretic comparator module 302 is arranged such that any transition in output state of the hysteretic comparator module 302 is synchronised or latched to a first clock signal $CLK_1$.

To illustrate the principle FIG. 3 shows a hysteretic comparator 201, which may operate in the same manner as discussed in relation to FIG. 2 to produce a comparator output $S_{CO}$ which will vary between the two output states, e.g. $V_H$ and $V_L$. The comparator output $S_{CO}$ is supplied to a latch 303 which is clocked by the first clock signal. In this example the hysteretic comparator 201 will transition from a first output state to a second output state as soon as the first signal $S_1$ at the first comparator input exceeds the second comparator input by H and will remain in that state until the first signal $S_1$ at the first comparator input drops below the second comparator input by H.

The output of the hysteretic comparator 201 itself thus transitions as soon as the relevant threshold defined by the hysteresis is reached.

The latch 303 will change state following a change in state of the output $S_{CO}$ of the hysteretic comparator 201, but will do so at a time defined by the first clock signal $CLK_1$. The latch 303 may be effectively configured to sample the comparator output $S_{CO}$ at a sample period defined by the first clock signal $CLK_1$ and to maintain that value as its output until the next sample period.

FIG. 3 illustrates the general form of the waveform of the time-encoded signal $S_{PWM}$ which is generated at a first node 304 at the output of the hysteretic comparator module 302.

FIG. 3 also illustrates, in an expanded form, an example of a possible relationship between the output signal $S_{PWM}$ and the output $S_{CO}$ of the hysteretic comparator 201 at the transition from the high output state to the low output state. In this example the latch 303 may sample the output $S_{CO}$ of the hysteretic comparator 201 at periods defined by a rising edge of the first clock signal $CLK_1$. It can be seen that at a first sample period defined by a rising edge of the first clock signal $CLK_1$, the output $S_{CO}$ of the hysteretic comparator 201 is still in the high state and so the latch 303 maintains its output in the high state. Subsequently, before the next sample period, the first signal $S_1$ at the first comparator input of the hysteretic comparator 201 reaches the relevant threshold and thus the output $S_{CO}$ of the hysteretic comparator 201 changes at that point in time, as indicated by the dashed line. However the latch 303 maintains its output in the high state until the next sample period. At this point the latch 303 samples the output $S_{CO}$ of the hysteretic comparator 201 and switches to the low output state.

It will thus be appreciated that the output from the latch 303, and hence from the hysteretic comparator module 302, will still be a PWM signal with cycle by cycle durations of $\alpha$ and $\beta$ of the first and second output states, but in this case the durations $\alpha$ and $\beta$ and hence the overall cycle period T will be integer multiples of the period of the first clock signal $CLK_1$.

It should be noted that the hysteretic comparator 201 and latch 303 have been illustrated as separate components for ease of description. In some embodiments the hysteretic comparator module 302 may be implemented with a distinct hysteretic comparator 201 and latch 303 as illustrated. In some embodiments however the hysteretic comparator module 302 may comprise a latched comparator which receives the first clock signal and which transitions between output states based on the comparison and at a time defined by the first clock signal. In which case there may not be a separate output signal $S_{CO}$. There are various ways in which the hysteretic comparator module 302 could be implemented. One skilled in the art will be well aware of how to implement a comparator with hysteresis and to ensure that transitions in the output time-encoded signal $S_{PWM}$ are synchronised to a clock signal.

Constraining the time-encoded signal $S_{PWM}$ which is output from the hysteretic comparator module 302 to change state at a time synchronised to the first clock signal $CLK_1$ will result in the durations $\alpha$ and $\beta$ possibly being different from what they might otherwise have been, introducing a quantisation error. However it will be noted that the feedback signal $S_{FB}$ is derived from the time-encoded signal $S_{PWM}$ which is output from the hysteretic comparator module 302. The quantisation error thus occurs within the loop of the time-encoding modulator circuit 301, which provides some noise shaping. Thus the time-encoded signal at the first node 304 is synchronised to the first clock signal and the feedback signal is derived from the first node 304.

As noted above the output $S_{CO}$ of the hysteretic comparator 201 will change state as soon as the first signal $S_1$ reaches the relevant threshold. However the output time-encoded signal $S_{PWM}$ will only change state at the next relevant clock edge of the first clock signal $CLK_1$. This can be seen as introducing an error in the duration of the relevant pulse, e.g. in the duration $\alpha$ by extending the duration. However, as the feedback signal $S_{FB}$ is derived from the synchronised time-encoded signal $S_{PWM}$, the polarity of the error signal $\epsilon$ will only change when the time-encoded signal $S_{PWM}$ changes state. This means that even through the output $S_{CO}$ of the hysteretic comparator 201 may have changed state, the integrated error signal, i.e. the first signal $S_1$, will continue increasing above +H or decreasing below −H as appropriate until the time-encoded signal $S_{PWM}$ changes state. At the point at which the time-encoded signal $S_{PWM}$ changes state, the value of the integrated signal $S_1$ will thus be greater in magnitude than otherwise would have been the case. Therefore, the amount of change in the integrated error signal $S_1$ that is required to reach the relevant threshold for the hysteretic comparator 201 to swap back to the other output state will also be greater. It can therefore be seen that the error introduced by extending the duration α to synchronise with a clock edge of the first clock signal $CLK_1$ is, in effect, carried forward into determination of the duration β in a way that maintains the duty cycle.

By introducing the quantisation error within the loop of the time-encoding modulator circuit 301 in this way, the time-encoding modulator circuit 301 thus provides noise shaping in a similar way as discussed above in relation to the VCO 104 of FIG. 1, but provides a time-encoded signal $S_{PWM}$ which is synchronised to a first clock signal. This means that the durations of pulses of the time encoded signal $S_{PWM}$ can be supplied directly to a counter that is synchronised to the first clock signal.

It should be noted that in the embodiment of FIG. 3, the feedback signal $S_{FB}$ is subtracted from the input signal $S_{IN}$ to provide the error signal ε which will thus be of opposite polarity, with respect to the midpoint voltage VMID, to the output state of the hysteretic comparator module 302. The integrator may be a non-inverting integrator, to preserve the polarity of the error signal ε and the first signal $S_1$ may be applied to a non-inverting input of the hysteretic comparator 201 to provide negative feedback. Thus, whilst the hysteretic comparator module 302 is outputting the low output state $V_L$ (i.e. the less positive or more negative output voltage), the polarity of the error signal will lead to the first signal $S_1$ increasing (becoming more positive) until the high (more positive/less negative) threshold is reached. Then, when the output of the hysteretic comparator module 302 swaps to the high output state $V_H$ the polarity of the error signal will result in the first signal $S_1$ value reducing (becoming less positive) until the low (less positive/more negative) threshold is reached, where the output state will swap again (at the next clock edge of the first clock signal) and so on. As noted previously however in some embodiments the feedback signal $S_{FB}$ may be summed with the input signal $S_{IN}$, in which case the integrator may be an inverting integrator or the first signal $S_1$ from the integrator may be applied to an inverting input of the hysteretic comparator 201 to maintain negative feedback. As also noted previously level shifting, i.e. applying a scaling factor and/or an offset, may be applied to at least one of the input signal $S_{IN}$ or the feedback signal $S_{FB}$ prior to or as part of the combination.

Figure 4:
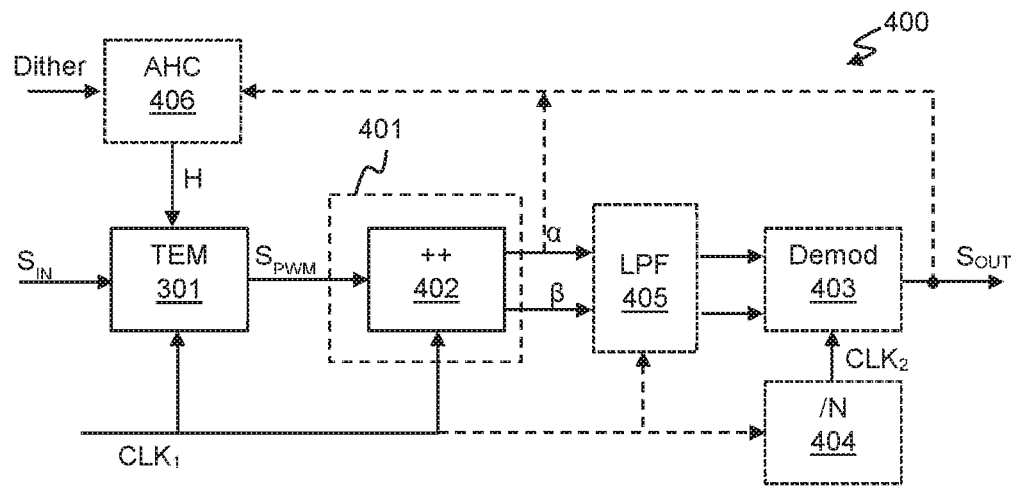
FIG. 4 illustrates an ADC circuit comprising a time-encoding modulator according to an embodiment.

FIG. 4 illustrates an ADC circuit 400 utilising a time-encoding modulator 301 according to an embodiment. As described with reference to FIG. 3 the time-encoding modulator 301 receives an analogue input signal $S_{IN}$ and a first clock signal $CLK_1$ and generates a time-encoded signal $S_{PWM}$ which in this case is a PWM signal with transitions in the time-encoded signal being synchronised to the first clock signal $CLK_1$. The time-encoded signal $S_{PWM}$ is supplied to a TDC 401, which in this example comprises a counter 402 configured to the count the number of pulses of a second clock signal in the periods defined by the time-encoded signal $S_{PWM}$. The second clock signal which is used to clock the counter 402 is synchronised to the first clock signal and may conveniently, as illustrated in FIG. 4, be a version of the first clock signal $CLK_1$, however it would be possible to use to a second clock which is a frequency multiple of the first clock signal $CLK_1$.

Given that the transitions in the time-encoded signal $S_{PWM}$ are synchronised to the first clock signal $CLK_1$ the durations of the periods α and β of the time-encoded signal $S_{PWM}$ will correspond exactly to integer multiples of the period of the first clock signal $CLK_1$. The counter can thus produce count values indicative of the periods α and β without introducing any quantisation error.

FIG. 4 illustrates a single counter 402. The counter may be arranged to count during each pulse of the time-encoded signal, high or low, and reset at the end of each pulse. In some implementations the counter 402 may be provided by first and second counters. The first counter may be configured to count during a period of the first output state of the time-encoded signal $S_{PWM}$, e.g. to determine a count value for α, with the second counter being configured to count during a period of the second output state, e.g. to determine a count value for β. Other arrangements are possible however.

As mentioned the level of the input signal $S_{IN}$ is encoded by the duty cycle of the pulses in the time-encoded signal $S_{PWM}$ and may be decoded as $(\alpha-\beta)/(\alpha+\beta)$ or as $\alpha/(\alpha+\beta)$. Providing separate counts for α and β allows the desired demodulation to a digital value to be performed as will be described in more detail below. However one counter could be arranged to provide a count of the cycle period T, i.e. a count directly of α+β. Additionally or alternatively an up-down counter could be arranged to increment during the pulse of one output state and decrement during the pulse of the other output state to provide a count value indicative of α−β.

The count values, which in this example may be the count values α and β, may be provided to a demodulator 403 for conversion to a digital output, e.g. as $(\alpha-\beta)/(\alpha+\beta)$ or as $\alpha/(\alpha+\beta)$, which digital value may be output as a digital output signal $S_{OUT}$.

There are various ways in which the count values could be demodulated to provide the digital output. As noted above however the input signal is encoded as the duty cycle of the time-encoded signal $S_{PWM}$. As the cycle period itself T is variable this involves a divide operation, i.e. the value of interest is $(\alpha-\beta)/(\alpha+\beta)$ or as $\alpha/(\alpha+\beta)$. Normally divide operations may be computationally expensive.

In embodiments of the disclosure however the demodulation may be achieved in a computationally efficient way through use of a sigma-delta modulator (SDM).

Figure 5A:
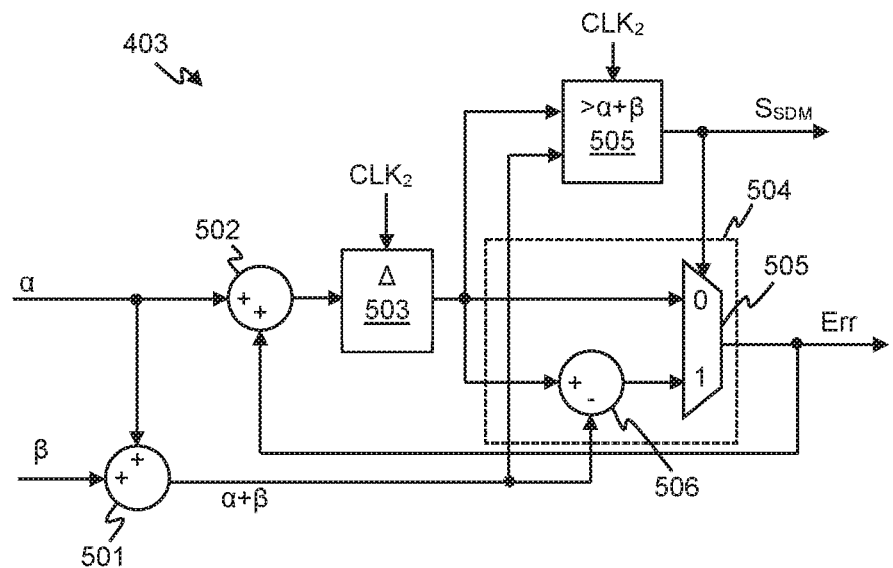
FIGS. 5a and 5b illustrate examples of sigma-delta demodulators.

FIG. 5a illustrates one example of a suitable SDM based demodulator 403. In this example the SDM demodulator 403 receives counts values α and β and thus the two count values are added, by adder 501, to provide a value equal to α+β.

The SDM demodulator 403 comprises adder 502, memory 503, modulus block 504 and comparator 505. The modulus block 504 is configured to apply a modulus operation to the output of the memory 503 where the modulus operator is defined by the value α+β. Thus the output of the modulus block 504 is equal to the value presently stored in memory 503 whilst below the value α+β, but when the value stored in memory exceeds α+β the output is equal to the present value minus α+β.

The modulus block 504 in this example is implemented by multiplexor 505 which receives the output of memory 503 directly as one input and receives the output of memory 503 from which the value α+β has been subtracted by subtractor 506 as a second input. The multiplexor 505 is controlled by the output of comparator 505 which compares the stored memory value to the value α+β.

Each clock cycle of a clock signal $CLK_2$ the SDM modulator adds the count value α to the output of the modulus block and stores the new value in memory 503. The value in memory 503 is also compared, by comparator 505, to the value α+β. So long as the stored memory value is lower than α+β supplied, the output of the comparator 505 remains low, and thus multiplexor 505 outputs the stored value of memory 503. Thus the value stored in memory 503 will increment by an amount equal to α until the value in memory 503 exceeds α+β. At this point the output of the comparator 505 will go high, to output a pulse. The multiplexor 505 will thus switch to outputting its second input, which is equal to the stored memory value minus α+β. This is the value that will thus be added to the count value α and stored in memory 503 in the next clock cycle.

The operation of the SDM demodulator 403 thus produces a series of pulses at the output of comparator, where the frequency of the pulses depends on the ratio of the value α to the defined threshold α+β, in other words the output $S_{SDM}$ of the SDM demodulator 403 is a pulse-density modulated data stream $S_{SDM}$ where the pulse density depends on α/(α+β). Such a PDM data stream is thus a digital representation of the input signal $S_{IN}$ to the ADC circuit 400 illustrated in FIG. 4. The PDM data stream $S_{SDM}$ may thus be output as the output signal $S_{OUT}$ or may be converted to any other digital format as desired for the output signal $S_{OUT}$.

Figure 5B:
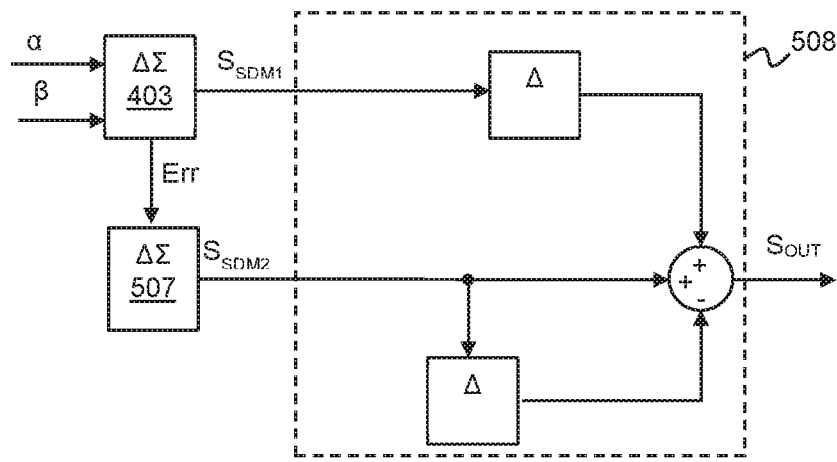

Note that FIG. 5a illustrates a first order sigma-delta arrangement. As will be understood by one skilled in the art the same principles could be extended to higher order modulators, for instance according to the known MASH (Multi-stage-noise-shaping) arrangement, in which case the output of the modulus block 504 during the period when the output of comparator 505 is high could be provided as an error signal for use by a subsequent stage. FIG. 5b illustrates one example of a second order SDM demodulator. A first SDM demodulator 403 such as illustrated in FIG. 5a receives the input count values α and β and produces a first PDM signal $S_{SDM1}$, as discussed above. The error signal Err is supplied to a further SDM modulator 507 which produces a second PDM signal $S_{SDM2}$ based on the error, which is combined with the first signal via recombination stage 508.

Conveniently the SDM clock signal $CLK_2$ used to control the SDM demodulator(s) will be synchronised to the first clock signal $CLK_1$, to which the time-encoded signal is synchronised. Referring back to FIG. 4 the SDM clock signal $CLK_2$ may conveniently be derived from the first clock signal $CLK_1$, e.g. by frequency divider 404. The SDM demodulator may thus be clocked at a lower clock rate than the TDC 401, e.g. at a slower clock rate than the counter 402. Operating a lower clock rate may result in some of the power of higher frequency components folding down into the signal band of interest and increasing the noise with the signal band. In some implementations therefore a filter arrangement 405 may be arranged to provide filtering of the count values α and β for anti-aliasing. The filter arrangement 405 may apply low-pass filtering to the count values α and β in any convenient way.

SDM based demodulators such as illustrated in FIG. 5a or 5b are thus one efficient way in which the time-encoded signal may be demodulated. It should be understood however that other demodulation techniques could be applied in some implementations.

As noted above, and as will be understood by one skilled in the art, the durations α and β of the two states of time-encoded signal $S_{PWM}$ will vary with the level of the input signal $S_{IN}$, as will the cycle period T (T=α+β). In general the cycle period may vary according to $T=\alpha+\beta=T_0/(1-X^2)$, where $T_0$ is cycle period for a signal of zero magnitude and X is the input signal magnitude, normalised to a maximum value of 1 and referenced so a signal of zero magnitude corresponds to an input at the midpoint voltage between the two output states $V_H$ and $V_L$. In such case the cycle period $T_0$ corresponding to an input signal of zero magnitude will be the cycle period of shortest duration. This condition is referred to as the limit cycle and the period $T_0$ is the limit cycle period. This corresponds to the fastest cycle frequency $f_0=1/T_0$ which is referred to as the limit cycle frequency. It can be seen that the cycle period T can increase significantly at higher input signal magnitudes. For instance at a signal magnitude of nine tenths of the maximum signal level, (|X|=0.9) the cycle period will be over five times longer than the limit cycle period $T_0$. The cycle frequency f will thus be over five times lower than the limit cycle frequency $f_0$. In some instances such a variation in cycle period and cycle frequency may be undesirable.

In some instances it may be desirable to limit the amount of change in the cycle period. One way to control the cycle period T is to control the amount of hysteresis applied by the hysteretic comparator module 302 of the time-encoding modulator 301. As noted previously with respect to FIG. 3, the output of the hysteretic comparator module 302 will change state at the first relevant clock edge following the signal $S_1$ (which is the integrated error signal) reaching the relevant threshold, e.g. exceeding +H or dropping below −H and will remain in that state until the other threshold is reached. The time that the signal remains in one state, i.e. duration α or β, will thus depend on how long it takes for the integrated error signal to change by the amount 2H. This will clearly depend on the level of the input signal $S_{IN}$ and hence the error between the input signal $S_{IN}$ and the feedback signal $S_{FB}$ but will also clearly depend on the threshold values the amount H of hysteresis applied.

In some embodiments therefore, as illustrated in FIG. 4, an adaptive hysteresis controller 406 may be arranged to control the amount H of hysteresis applied by the time-encoding modulator 301. There are many ways the hysteresis applied by a hysteretic comparator may be varied as will be understood by one skilled in the art.

The adaptive hysteresis controller 406 controls the hysteresis applied by the time-encoding modulator 301 so as to control the cycle period (and cycle frequency). The adaptive hysteresis controller 406 thus receives an indication of the cycle period.

In some instances the count value α+β which is produced or derived from the output of counter 402 could be supplied to the adaptive hysteresis controller 406. The adaptive hysteresis controller 406 may be configured to vary the amount of hysteresis applied so as to keep this value within a defined range. Thus as the signal level increases, as the cycle period, and hence the count value α+β, starts to increase the amount of hysteresis applied could be reduced and vice versa. In some embodiments the adaptive hysteresis controller 406 may receive the output signal $S_{OUT}$ which is indicative of the input signal level, and hence the expected cycle period, and control the hysteresis applied accordingly.

In some instances the adaptive hysteresis controller 406 may thus controllably vary a value $H_X$ of the hysteresis applied so as to reduce the amount of hysteresis applied as the magnitude of the input signal increases, as indicated by the output signal $S_{OUT}$ or indication of duty cycle, so as to maintain the cycle period within a defined range. In some instances the hysteresis may be generally controlled according to:

$$H_X = H_0 \cdot (1 - X_e^2) \qquad \text{(eqn. 1)}$$

where $H_0$ is the hysteresis applied at zero input signal magnitude and $X_e$ is an estimate of the normalised signal X, derived from the output signal $S_{OUT}$ or from the count values α and β, e.g. as an indication the duty cycle (α−β)/(α+β) or α/(α+β).

Controlling the hysteresis applied in this way may allow the cycle period of the time-encoded signal $S_{PWM}$ to be controlled to remain substantially constant. In some instances this may provide some benefits for the demodulation of the time encoded signal. For instance the TDC 401 could output a sample value according to the determined count values as α−β. This value is indicative of the duty cycle of the time-encoded signal and hence the input signal, but is scaled non-linearly due to the varying cycle period. If the hysteresis is controlled so that the cycle period does not vary substantially the non-linearity may be relatively low and the value α−β could be used as the indication of signal level. The count of α−β could only be determined at the end of each cycle and the timing of the cycles may vary slightly, i.e. the sample rate would be irregular. The count value α−β could be supplied to an asynchronous sample rate converter to converter the irregular sample rate signal to a regular sample rate signal, e.g. by interpolation, as will be understood by one skilled in the art.

Thus controlling the hysteresis applied in this way may allow the cycle period of the time-encoded signal $S_{PWM}$ to be controlled to remain substantially constant on a cycle-by-cycle basis. Additionally, or alternatively, the hysteresis control could be used to enable operation in different modes, for instance to provide a trade-off between performance and power consumption. For example the limit cycle frequency of the time-encoded signal could be reduced to save power under conditions when there is little apparent input signal activity or based on some other characteristic of the input signal. An indication of input signal activity could, in some implementations, be detected autonomously, for example, by filtering or envelope detecting a demodulated output signal. Additionally or alternatively an indication of signal activity or a command to alter an operating mode may be received by an explicit control input from a controller in the host system. For an embodiment such as described with reference to FIG. 4, where the hysteresis may be adaptively be controlled cycle-by-cycle (for at least one operating mode), the limit cycle frequency might be altered by altering the target cycle period directly or more indirectly for example by altering the value of the quiescent hysteresis $H_0$ discussed with respect to equation 1. Additionally or alternatively in at least some modes of operation the hysteresis may not be controlled on a cycle-by-cycle basis but a fixed value of hysteresis applied may be controlled to control the limit cycle period to implement a desired mode.

The time encoding modulator may thus be operable in at least a first mode with a limit cycle frequency, i.e. cycle frequency at a quiescent input signal level, of a first frequency and a second mode with a limit cycle period of a second, different, frequency, wherein the hysteresis controller is operable to vary the amount of hysteresis applied by the hysteretic comparator module so as to implement the first and second modes. The first mode may be a higher power and/or high performance mode than the second mode with the first frequency being higher than the second frequency. In the first mode the hysteresis controller may, in some implementations, be operable so that the cycle period is controlled to be with a first defined range on a cycle-by-cycle basis, i.e. to provide adaptive control. In the second mode the hysteresis may be fixed, as the second mode may correspond to a mode of operation for low signal activity, although in some implementation adaptive hysteresis control on a cycle-by-cycle basis may also be implemented in the second mode.

For example, the circuit could be designed such that the limit cycle frequency is controlled to be a low frequency, say 100 kHz, for input voltage signal activity smaller than a defined low level, say −30 dBV, but to increase linearly to a higher frequency, say 1 MHz, for signals at a defined upper limit of say 0 dBV.

It will also be appreciated that the frequency of the first clock signal $CLK_1$ used to latch the hysteretic comparator module 302 and clock the TDC 401 should be sufficiently fast to provide sufficient accuracy for determining the duty-cycle of the time-encoded signal. A relatively high cycle frequency may thus require a relatively fast first clock signal $CLK_1$ to determine the duty-cycle to a sufficient accuracy. However a lower cycle frequency, i.e. a longer cycle period α+β, allows the duty cycle to be determined to the same proportional error with a slower clock. The frequency of the first clock signal may thus be reduced to provide similar accuracy in the lower-power mode of operation, or may be reduced further to deliberately provide a lower accuracy in the lower-power mode of operation.

The use of a time-encoded modulator 301 where the transitions of the output time-encoded signal $S_{PWM}$ are synchronised to a first clock signal allows the time-encoded signal $S_{PWM}$ to be supplied directly to counter 402 as discussed above. However this operation could, in some instances, result in unwanted tones appearing in the time-encoded signal $S_{PWM}$ and hence the output signal $S_{OUT}$. In some embodiments therefore some dither may be applied to the time-encoded signal $S_{PWM}$ so as to avoid or reduce the presence of such unwanted tones. In some embodiments dither may be applied by applying dither to the hysteresis applied by the hysteretic comparator module 302 of the time-encoding modulator 301. Dithering the hysteresis applied, i.e. varying the amount of hysteresis applied in a controlled way, will mean that a given input signal level will result in first durations α and β at a first time (at a first hysteresis level) but the same signal level would result in second, different, durations α and β at a second time (when at a different hysteresis level). Thus the chance of constant or regular signal components leading to unwanted tones is reduced.

The adaptive hysteresis controller 406 may thus vary the hysteresis H applied by the time-encoding modulator in a controlled way, for instance in response to a received dither signal. Dither may be applied whether or not the adaptive hysteresis controller 406 is configured to control the cycle period within a defined range, i.e. the adaptive hysteresis controller 406 may control the hysteresis to apply dither and/or to maintain the cycle period in a defined range.

Figure 6:
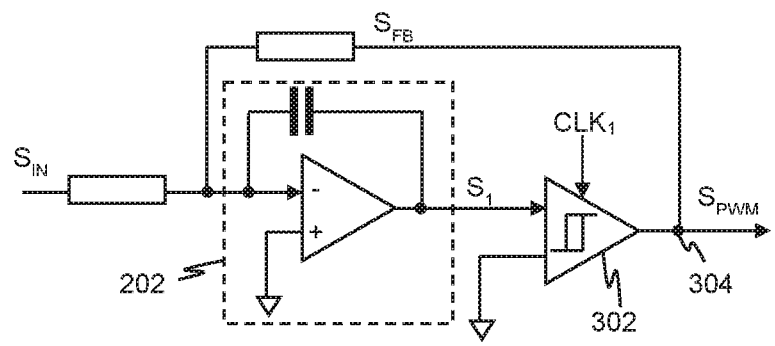
FIG. 6 illustrates an example of a time-encoding modulator in more detail.

As noted above the time-encoding modulator 301 may be based on a topology similar to an asynchronous sigma-delta modulator. FIG. 6 illustrates an example of a time-encoding modulator 301 in more detail. In this example, the output signal $S_{PWM}$ serves as feedback signal $S_{FB}$ and is combined by summation with the input signal $S_{IN}$ via respective resistors. These resistors may be of different values, to obtain a signal-band scaling or gain between input signal $S_{IN}$ and output signal $S_{PWM}$. In this example the loop filter comprises an inverting op-amp based integrator 202 arranged to integrate the combined signal in the forward signal path and the hysteretic comparator module 302 comprises a latched comparator arranged to apply hysteresis.

Figure 7:
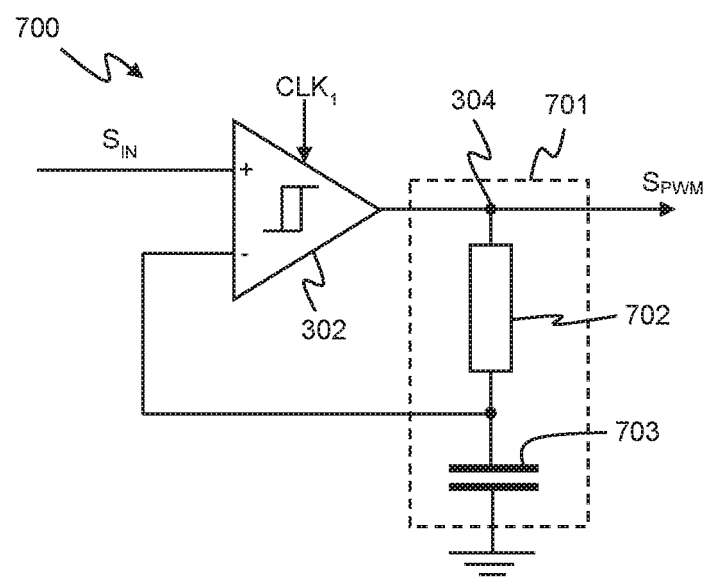
FIG. 7 illustrates another example of a time-encoding modulator.

However other topologies may be used. FIG. 7 illustrates an alternative example of a circuit 700 which could be used as the time-encoding modulator 301. In this example the input signal $S_{IN}$ is supplied to a first comparator input of the hysteretic comparator module 302, which may be a latched hysteretic comparator or may be a comparator-latch combination as described above. In this embodiment a loop filter 701 is arranged to apply filtering to a feedback path that extends between the TE node 304 and the second input of the hysteretic comparator module 302. The loop filter 701 in this example comprises a resistor 702 and capacitor 703.

In this example the input signal $S_{IN}$ and the feedback signal $S_{FB}$ are thus applied to separate inputs of the hysteretic comparator module 302 for comparison, with hysteresis. The thresholds for the input signal are thus defined by the filtered feedback signal $S_{FB}$. In effect the hysteretic comparator module 302 compares a difference between the input signal $S_{IN}$ and the feedback signal $S_{FB}$ with thresholds defined by the amount of hysteresis.

In a similar fashion as discussed above the hysteretic comparator module 302 will swap from one output state to the other when the difference between the signals at the first and second comparator inputs exceeds +H or −H as appropriate. It will be understood that the embodiment of FIG. 7 thus compares the difference or error between the input signal and feedback signal directly, rather than form an error signal such as discussed with reference to FIG. 3. The loop filter 701 effectively filters the signal in the feedback path. In essence when the output of the hysteretic comparator module 302 is in the high state the capacitor 703 will charge until the voltage at the second comparator input is equal to $S_{IN}$+H. At this point, at the next relevant clock edge of the first clock signal $CLK_1$, the output of the hysteretic comparator module 302 will swap to the low state and the capacitor 703 will start discharging until the voltage drops to $S_{IN}$−H. The rate of charging and discharging will depend on the voltage difference across the resistor 702, which depends on the output state and the present voltage of the capacitor 703. As explained the capacitor voltage will vary between $S_{IN}$−H and $S_{IN}$+H, and thus the rate of charging or discharging of capacitor 703 thus depends on the error between the output state and the input signal. This provides similar operation as the configuration illustrated in FIG. 6 but can be implemented in a small and low power circuit arrangement.

It should be noted that the embodiments discussed above have been discussed with reference to single-ended signals for ease of explanation. However in some embodiments the input signal $S_{IN}$ may be a differential signal. In some embodiments therefore any components in the feedforward path may be differential and/or if the output stage is differential, e.g. to an H-bridge output, any components of the feedback path may be differential. The hysteretic comparator module may thus have differential inputs. One skilled in the art would readily understand how the embodiments discussed above may be implemented for differential signals.

Embodiments thus relate to time-encoding modulators that generate a time-encoded signal that is synchronised to a first clock signal. At least some embodiments may be considered as synchronous self-oscillating type modulators. Embodiments may be usefully used in a variety of applications and may particular be useful for an ADC circuit where the time-encoded signal may be input to a counter arrangement that is also synchronised to a first clock signal. Conveniently the counter output may be demodulated by a sigma-delta demodulator.

Embodiments may thus provide a low power ADC circuit. The ADC circuit may be part of an audio signal path. The input signal may thus be an analogue audio signal. In some embodiments the ADC circuit may be used to receive input signals from a force sensor transducer.

Embodiment of the present disclosure may be implemented as an integrated circuit. Embodiments of the present disclosure may be implemented in an electronic device. The electronic device may be at least one of: a portable device; a battery powered device; a communication device; a mobile or cellular telephone or a smartphone; a computing device; a laptop, notebook or tablet computer; a gaming device; a wearable device; a voice controlled device.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. A time-encoding modulator circuit comprising:
   a hysteretic comparator module configured to generate a time encoded signal at a first node based on an input; and
   a hysteresis controller configured to controllably vary, in use in a first mode of operation, an amount of hysteresis applied by the hysteretic comparator module so as to control a cycle period of the time encoded signal within a first defined range;
   wherein the hysteretic comparator module is configured such that any change in state of the time encoded signal at the first node is synchronised to a first clock signal.

2. The time-encoding modulator circuit as claimed in claim 1 wherein the hysteresis controller is further configured to control the hysteresis applied by the hysteretic comparator to dither the cycle period of the time encoded signal within said defined range.

3. The time-encoding modulator circuit as claimed in claim 1 wherein hysteresis controller is further operable in a second mode of operation to control the amount of hysteresis applied by the hysteretic comparator to provide a limit cycle frequency which is different to a limit cycle frequency of the first mode.

4. The time-encoding modulator circuit as claimed in claim 1 comprising a counter configured to receive the time encoded signal and generate count values of the number of clock periods of a second clock signal during periods defined by the time encoded signal, wherein the second clock signal is synchronised to the first clock signal.

5. The time-encoding modulator circuit as claimed in claim 4 wherein the hysteresis controller is configured to receive a count value from said counter and to control hysteresis applied by the hysteretic comparator based on said count value.

6. The time-encoding modulator circuit as claimed in claim 4 wherein the time encoded signal comprises cycles of pulses of first and second states and the counter is configured to generate a first count value for the duration of the pulse of the first state of the time-encoded signal during each cycle and a second count value for the duration of the pulse of the second state of the time-encoded signal during each cycle.

7. The time-encoding modulator circuit as claimed in claim 4 wherein second clock signal is the same as the first clock signal.

8. The time-encoding modulator circuit as claimed in claim 4 further comprising a demodulator configured to receive the count values from the counter and generate a digital output signal.

9. The time-encoding modulator circuit as claimed in claim 8 wherein the hysteresis controller is configured to receive said digital output signal to control hysteresis applied by the hysteretic comparator based on said digital output signal.

10. The time-encoding modulator circuit as claimed in claim 8 wherein the demodulator comprises a demodulator input for receiving a first received value, an adder for adding the first received value to an output from a modulus block, a memory for storing the output of the adder and a demodulator comparator for comparing a value stored in the memory to a second received value, wherein the modulus block is configured to apply a modulo operation to the output of the memory based on the second received value and wherein the first and second values are derived from count values received from said counter.

11. The time-encoding modulator circuit as claimed in claim 8 comprising a filter arrangement configured to filter the count values provided to the demodulator.

12. The time-encoding modulator circuit as claimed in claim 1 wherein the circuit is configured such that a feedback signal from the first node is combined with the input signal to generate a combined signal, a loop filter is configured to apply filtering to said combined signal and one input of the hysteretic comparator module is configured to receive an output of the loop filter.

13. The time-encoding modulator circuit as claimed in claim 12 wherein said loop filter is an integrator.

14. The time-encoding modulator circuit as claimed in claim 1 comprising a loop filter configured to receive a feedback signal from the first node and generate a filtered feedback signal and wherein a first input of the hysteretic comparator module receives the input signal and a second input of the hysteretic comparator module receives the filtered feedback signal.

15. The time-encoding modulator circuit as claimed in claim 14 wherein the loop filter comprises a resistor-capacitor filter.

16. The time-encoding modulator circuit as claimed in claim 1 wherein the hysteretic comparator module comprises a latched comparator configured to receive the first clock signal, wherein any changes in output state of the latched comparator is synchronised to the first clock signal.

17. The time-encoding modulator circuit as claimed in claim 1 wherein the hysteretic comparator module comprises a hysteretic comparator and a latch coupled to an output of the hysteretic comparator, wherein the latch is configured to be clocked by the first clock signal.

18. An electronic device comprising the time-encoding modulator circuit of claim 1.

19. A time-encoding modulator comprising:
a feedforward path for receiving an input signal and outputting a time encoded signal, the feedforward path comprising a loop filter upstream of a hysteretic comparator module;
a feedback path for providing a feedback signal from an output of the hysteretic comparator module to be combined with the input signal, and
a hysteresis controller configured to controllably vary, in use, an amount of hysteresis applied by the hysteretic comparator module so as to control a cycle period of the time encoded signal;
wherein the loop filter is configured to apply filtering to the combined input and feedback signals and the hysteretic comparator module is configured to receive the output of the loop filter and to generate the time encoded signal at the output of the hysteretic comparator module output; and
wherein the hysteretic comparator module is configured such that any change in state of the time encoded signal at the hysteretic comparator module output is synchronised to a first clock signal.

20. A time-encoding modulator for receiving an input signal and outputting a time encoded signal comprising:
a hysteretic comparator module configured to receive the input signal at a first input and a feedback signal at a second input and to generate a time encoded signal at an output node;
a hysteresis controller configured to controllably vary, in use, an amount of hysteresis applied by the hysteretic comparator module so as to control a cycle period of the time encoded signal;
a feedback path coupled to the output node to provide the feedback signal to the second comparator input, and
a loop filter configured to apply filtering to the feedback path;
wherein the hysteretic comparator module is configured such that any change in state of the time encoded signal at the hysteretic comparator module output is synchronised to a first clock signal.

* * * * *